United States Patent

Bansal et al.

(10) Patent No.: US 9,755,518 B2
(45) Date of Patent: Sep. 5, 2017

(54) CURRENT MEASURMENTS IN SWITCHING REGULATORS

(71) Applicant: QUALCOMM Incorporated, San Diego, CA (US)

(72) Inventors: Mukesh Bansal, San Diego, CA (US); Michael McGowan, Mesa, AZ (US); Iulian Mirea, San Diego, CA (US); Qadeer Khan, Bangalore (IN); Troy Stockstad, Chandler, AZ (US); Brett Walker, San Diego, CA (US); Todd Sutton, Del Mar, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/179,229

(22) Filed: Jun. 10, 2016

(65) Prior Publication Data

US 2017/0229962 A1  Aug. 10, 2017

Related U.S. Application Data

(60) Provisional application No. 62/337,530, filed on May 17, 2016, provisional application No. 62/292,000, filed on Feb. 5, 2016.

(51) Int. Cl.
| | | |
|---|---|---|
| *H02M 3/158* | (2006.01) | |
| *H02M 1/08* | (2006.01) | |
| *H02M 1/00* | (2006.01) | |

(52) U.S. Cl.
CPC ............. *H02M 3/158* (2013.01); *H02M 1/08* (2013.01); *H02M 2001/0009* (2013.01)

(58) Field of Classification Search
CPC . H02M 3/158; H02M 1/08; H02M 2001/0009
See application file for complete search history.

(56) References Cited

U.S. PATENT DOCUMENTS

| 7,391,199 B2 * | 6/2008 | Akashi ................ H02M 3/1588 323/284 |
|---|---|---|
| 7,675,757 B2 * | 3/2010 | Nakamura ............ H02M 3/156 363/13 |

(Continued)

FOREIGN PATENT DOCUMENTS

| EP | 2752965 A1 | 7/2014 |
|---|---|---|
| WO | 2015077180 A1 | 5/2015 |

OTHER PUBLICATIONS

International Search Report—PCT/US2017/014297—ISA/EPO—dated May 30, 2017.
Written Opinion—PCT/US2017/014297—ISA/EPO—dated May 30, 2017.

*Primary Examiner* — Fred E Finch, III
*Assistant Examiner* — Demetries A Gibson
(74) *Attorney, Agent, or Firm* — Haynes and Boone, LLP

(57) ABSTRACT

Features and advantages of the present disclosure include a switching regulator and current measurement circuit. In one embodiment, a switching transistor in the switching regulator has a first voltage on a first terminal and a switching voltage on a second terminal. A current measurement circuit has first and second input terminals. A first switch couples the second terminal of the switching transistor to the first terminal of the current measurement circuit when the switching transistor is on, where the second input terminal of the current measurement circuit is coupled to the first terminal of the switching transistor and measurement(s) may be taken. When the switching transistor is off, the first and second input terminals of the current measurement circuit are coupled together, and measurements emulate zero current through the switching transistor.

22 Claims, 12 Drawing Sheets

(56) References Cited

U.S. PATENT DOCUMENTS

| | | | |
|---|---|---|---|
| 7,936,160 B1 | 5/2011 | Sheehan | |
| 8,076,919 B2 | 12/2011 | Liu et al. | |
| 8,159,205 B1 | 4/2012 | Latham, II et al. | |
| 8,368,363 B2* | 2/2013 | Nishida | G01R 19/0092 323/225 |
| 2005/0057228 A1 | 3/2005 | Shih | |
| 2007/0013350 A1 | 1/2007 | Tang et al. | |
| 2008/0130330 A1 | 6/2008 | Tao | |
| 2010/0327837 A1* | 12/2010 | Tsugawa | H02M 1/32 323/285 |
| 2011/0121805 A1 | 5/2011 | Mirea et al. | |
| 2012/0019226 A1* | 1/2012 | Wiktor | H02M 3/156 323/285 |
| 2012/0153920 A1 | 6/2012 | Guenther et al. | |
| 2012/0286576 A1 | 11/2012 | Jing et al. | |
| 2012/0319677 A1* | 12/2012 | Bogner | G01R 19/0092 324/126 |
| 2014/0125304 A1* | 5/2014 | Wiethege | H02M 3/1563 323/282 |
| 2014/0225585 A1 | 8/2014 | Buthker | |
| 2014/0285014 A1* | 9/2014 | Calhoun | H02M 3/158 307/31 |
| 2015/0115923 A1* | 4/2015 | Shao | H02M 3/158 323/283 |
| 2015/0207401 A1* | 7/2015 | Zhang | H02M 3/158 323/271 |
| 2015/0291041 A1 | 10/2015 | Higuchi et al. | |
| 2016/0049861 A1* | 2/2016 | Ihs | H02M 3/158 323/282 |
| 2017/0060155 A1* | 3/2017 | Peluso | G05F 1/575 |

* cited by examiner

CURRENT MEASURMENTS IN SWITCHING REGULATORS

CROSS REFERENCE TO RELATED APPLICATIONS

The present application claims the benefit of U.S. Provisional App. No. 62/292,000, filed Feb. 5, 2016; and the benefit of U.S. Provisional App. No. 62/337,530, filed May 17, 2016, the content of both of which are incorporated herein by reference in their entireties for all purposes.

BACKGROUND

The present disclosure relates to switching regulators, and in particular, to current measurements in switching regulators.

Switching regulators are circuits that receive power in the form of voltage and current from a power source and output power at a different voltage for use by downstream electronic systems. Some switching regulators monitor current to carry out various functions. For example, some switching regulators may include a current control loop that monitors a current and uses the monitored current as a control variable in a feedback loop to control the behavior of the switching regulator.

However, measuring current in a switching regulator can be challenging. Switching regulators typically include at least one switch that is turned on and off (sometimes at very high speeds). Such switching action can produce transient voltages and currents, which compounds the difficulty in making a current measurement.

SUMMARY

Features and advantages of the present disclosure include circuits and methods for measuring current in a switching regulator. In one embodiment, the present disclosure includes a circuit comprising a switching regulator comprising a switching transistor, the switching transistor having a first terminal configured to receive a first voltage, a second terminal coupled to a switching node, and a control terminal configured to receive a control voltage to turn the switching transistor on and off, a current measurement circuit having a first terminal and a second terminal, a first switch configured between the switching node and the first terminal of the current measurement circuit, and a second switch configured between the second terminal of the current measurement circuit and the first terminal of the current measurement circuit, wherein the second terminal of the current measurement circuit is coupled to the first terminal of the switching transistor. When the switching transistor is on the first switch is closed and the second switch is open, and when the switching transistor is off the first switch is open and the second switch is closed.

In one embodiment, an average current through the switching transistor is measured by the current measurement circuit when the switching transistor is turned on and off.

In one embodiment, the current measurement circuit comprises a differential input.

In one embodiment, the current measurement circuit comprises an analog to digital converter having differential inputs coupled to receive a differential voltage across the first terminal of the current measurement circuit and the second terminal of the current measurement circuit.

In one embodiment, the current measurement circuit further comprises a voltage averaging circuit having a first input coupled to the first terminal of the current measurement circuit and a second input coupled to the second terminal of the current measurement circuit, the voltage averaging circuit configured to produce the differential voltage on differential outputs coupled to the differential inputs of the analog to digital converter, wherein the differential voltage from the voltage averaging circuit corresponds to an average current through the switching transistor.

In one embodiment, the voltage averaging circuit is a low pass filter.

In one embodiment, the current measuring circuit further comprises a reference transistor having a first terminal coupled to the first voltage, a second terminal coupled to a reference current source, and a control terminal coupled to a second control voltage equivalent to the control voltage on the control terminal of the switching transistor when the switching transistor is turned on.

In one embodiment, a first differential voltage across the first and second terminals of the switching transistor is combined with a second differential voltage across the first and second terminals of the reference transistor to determine a current through the switching transistor.

In one embodiment, the current measuring circuit further comprises a voltage averaging circuit having a first input coupled to the first terminal of the reference transistor and a second input coupled to the second terminal of the reference transistor, the voltage averaging circuit configured to produce the second differential voltage on differential outputs, wherein the second differential voltage is an average differential voltage.

In one embodiment, the circuit further comprises a third switch configured between the first terminal of the switching transistor and the second terminal of the current measurement circuit, a fourth switch configured between the first terminal of the reference transistor and the first terminal of the current measurement circuit, and a fifth transistor configured between the second terminal of the reference transistor and the second terminal of the current measurement circuit.

In one embodiment, the current measurement circuit further comprises a first analog to digital converter having differential inputs coupled to the first terminal of the current measurement circuit and the second terminal of the current measurement circuit and a second analog to digital converter having differential inputs coupled to the first terminal of the reference transistor and the second terminal of the reference transistor.

In one embodiment, the current measurement circuit further comprises a multiplexer having first differential inputs coupled to the first terminal of the current measurement circuit and the second terminal of the current measurement circuit and second differential inputs coupled to the first terminal of the reference transistor and the second terminal of the reference transistor and a first analog to digital converter having differential inputs coupled to differential outputs of the multiplexer.

In one embodiment, the current measurement circuit further comprises an analog to digital converter having differential inputs coupled to the first terminal of the current measurement circuit and the second terminal of the current measurement circuit and differential reference inputs coupled to the first terminal of the reference transistor and the second terminal of the reference transistor.

In one embodiment, the current measurement circuit comprises a sense transistor having a first terminal configured to receive the first voltage, a second terminal coupled to the switching node, and a control terminal configured to receive the control voltage on the control terminal of the switching transistor when the switching transistor is turned on.

In one embodiment, the switching transistor is a NMOS transistor.

In one embodiment, the switching transistor is a PMOS transistor.

In one embodiment, the current measurement circuit includes a third terminal and a fourth terminal, the circuit further comprises an NMOS switching transistor, the NMOS switching transistor having a first terminal configured to receive a reference voltage, a second terminal coupled to the switching node, and a control terminal configured to receive a second control voltage to turn the NMOS switching transistor on and off, a third switch configured between the switching node and the third terminal of the current measurement circuit, and a fourth switch configured between the fourth terminal of the current measurement circuit and the third terminal of the current measurement circuit, wherein a terminal of the fourth switch is coupled to the first terminal of the NMOS switching transistor. When the NMOS switching transistor is on the third switch is closed and the fourth switch is open, and when the NMOS switching transistor is off the third switch is open and the fourth switch is closed.

In one embodiment, the current measurement circuit determines an output current of the switching regulator.

In one embodiment, the current measurement circuit determines an input current of the switching regulator.

In one embodiment, the switching transistor is a Buck switching regulator.

In one embodiment, the switching transistor is a Boost switching regulator.

In another embodiment, the present disclosure includes a method of supplying power comprising generating a voltage between a first terminal and a second terminal of a switching transistor in response to a current between the first terminal and second terminal, wherein the first terminal receives a first voltage, the second terminal is coupled to a switching node, and a control terminal receives a control voltage to turn the switching transistor on and off, closing a first switch coupled between the second terminal of the switching transistor and a first terminal of a current measurement circuit when the switching transistor is turned on, wherein a second terminal of the current measurement circuit is coupled to the first terminal of the switching transistor, and closing a second switch coupled between the first terminal of the current measurement circuit and the second terminal of the current measurement circuit when the switching transistor is turned off, wherein when the switching transistor is on the first switch is closed and the second switch is open, and when the switching transistor is off the first switch is open and the second switch is closed.

In yet another embodiment, the present disclosure includes a circuit comprising a switching regulator comprising a switching means for selectively coupling a first voltage to a switching node, the switching means having a first terminal configured to receive the first voltage and a second terminal coupled to the switching node, means for measuring current in the switching means comprising a first terminal and a second terminal, first means for selectively coupling a switching voltage on the switching node to the first terminal of the means for measuring current, and second means for selectively coupling the first terminal and the second terminal of the means for measuring current together, wherein when the switching means couples the first voltage to the switching node the first means couples the switching voltage to the first terminal of the means for measuring current and the second means does not couple the first terminal and the second terminal of the means for measuring current together, and wherein when the switching means does not couple the first voltage to the switching node the first means does not couple the switching voltage to the first terminal of the means for measuring current and the second means couples the first terminal and the second terminal of the means for measuring current together.

The following detailed description and accompanying drawings provide a better understanding of the nature and advantages of the present disclosure.

DETAILED DESCRIPTION

In the following description, for purposes of explanation, numerous examples and specific details are set forth in order to provide a thorough understanding of the present disclosure. It will be evident, however, to one skilled in the art that the claims may include some or all of the features in these examples, alone or in combination with other features described below, and may further include modifications and equivalents of the features and concepts described herein.

Figure 1A:
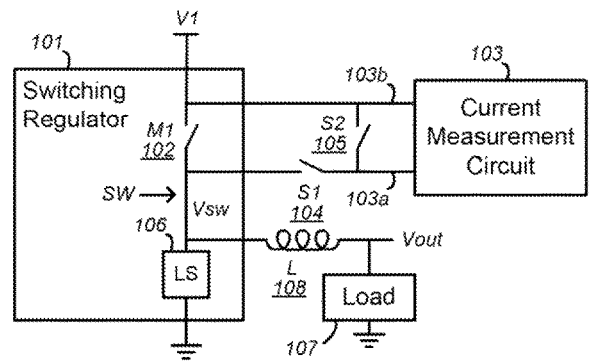
FIG. 1A illustrates a current measurement technique in a switching regulator according to an embodiment.

FIG. 1A illustrates a current measurement technique in a switching regulator according to an embodiment. Embodiments of the present disclosure include a current measurement circuit 103 having inputs configured across the terminals of a switch, such as a switching metal oxide semiconductor field effect transistor (i.e. "MOSFET" or just "FET"). The circuit in FIG. 1A includes a switching regulator 101 that receives an input voltage V1 on an input terminal and produces an output voltage Vout on an output terminal. The output terminal of switching regulator 101 may be coupled to a load 107 through an inductor ("L") 108, for example. Circuit elements may be coupled when such elements are directly connected or electrically responsive along a signal path via a voltage or current, for example. Switching regulator 101 includes at least one switching transistor M1 102. The input terminal of switching regulator 101 is coupled to a first terminal of switching transistor 102. A second terminal of switching transistor 102 is coupled to a switching node SW. Switching transistor 102 may turn on and off during the operation of switching regulator 101, causing switching node SW to be connected and disconnected to input voltage V1. Accordingly, switching node SW may have a changing switching voltage $V_{sw}$, for example. Switching transistor 102 may further have a control terminal (illustrated below) to receive a control voltage to turn the switching transistor on and off, for example. Switching node SW is also coupled to a low side ("LS") circuit element, which may be a diode, another switching transistor, or circuit for maintaining current through inductor 108 to load 107 when switching transistor 102 is turned off.

Features and advantages of the present disclosure include a current measurement circuit 103 having a first input terminal and a second input terminal coupled to terminals of the switching transistor to produce accurate measurements of the current through the switching transistor. In particular, a first switch S1 104 is configured between the switching node SW and a first terminal 103a of the current measurement circuit. A second switch S2 105 is configured between a second terminal 103b of the current measurement circuit and the first terminal 103a of the current measurement circuit.

When switching transistor 102 is turned on (switch closed), a voltage on the terminals of the transistor results in a corresponding current through the switching transistor. When switching transistor is turned off (switch open), the current goes to zero. Embodiments of the present disclosure emulate the current through the switching transistor 102 using switches S1 and S2. For example, when the switching transistor is on, S1 is closed and S2 is open. Accordingly, one terminal 103a of the current measurement circuit 103 is coupled to the switching node SW to receive the switching voltage $V_{sw}$, which is the same voltage on a terminal of the switching transistor 102. Another terminal 103b of the current measurement circuit 103 is coupled to the other terminal of the switching transistor to receive the input voltage V1. Accordingly, when switching transistor 102 is on, the inputs to the current measurement circuit 103 are at the same voltages as the terminals of the switching transistor 102. Thus, the current through the switching transistor may be determined using relationships established by current and voltage equations for the switching transistor, where a control terminal of the switching transistor may be set to a voltage to put the switching transistor in a particular region of operation as described below, for example. Advantageously, when the switching transistor 102 is off (i.e., open circuit with zero current), switch S1 is open and switch S2 is closed. Closing switch S2 couples the inputs of the current measurement circuit together to emulate zero current flow in the switching transistor. For example, in some embodiments, a voltage difference of zero between the inputs of the current measurement circuit may be translated into zero current through the switching transistor, which is an accurate reflection of the switching transistor current when the switching transistor is turned off.

Figure 1B:
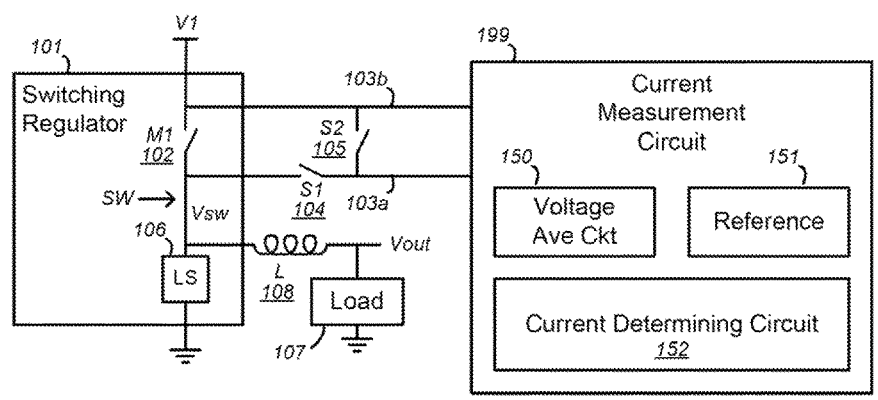
FIG. 1B illustrates a switching regulator and current measurement circuit according to another embodiment.

FIG. 1B illustrates a switching regulator and current measurement circuit according to another embodiment. In this example, switching regulator 101 includes a switching transistor M1 102 having one terminal configured to receive an input voltage V1 and a second terminal having a switching voltage $V_{sw}$. A current measurement circuit 199 is coupled to the switching transistor 102 using switches S1 104 and S2 105. As mentioned above, when the switching transistor 102 is on, switch S1 is closed and switch S2 is open, and when the switching transistor 102 is off, switch S1 is open and switch S2 is closed. In this example, current measurement circuit 199 may measure an average current through the switching transistor when the switching transistor is turned on and off. Accordingly, current measurement circuit 199 may include a voltage averaging circuit 150. Additionally, this example illustrates another feature of some embodiments. Current measurement circuit 199 may further include a reference circuit 151 to generate a reference voltage that tracks the voltage across the switch at the input of the current measurement circuit across variations of voltage (e.g., the input voltage V1) and variations in temperature, for example. Reference circuit 151 may include a reference transistor coupled to a reference current source as described in more detail below to produce a voltage that may be combined with the voltage across switching transistor 102 to determine current through the switching transistor 102, for example. Current measurement circuit 199 further includes a current determining circuit 152. Current determining circuit 152 may receive analog and/or digital signals based on the voltages across switching transistor 102 and reference circuit 151 and determine a current measurement, for example. Example implementations and detailed embodiments are described below.

Figure 2A:
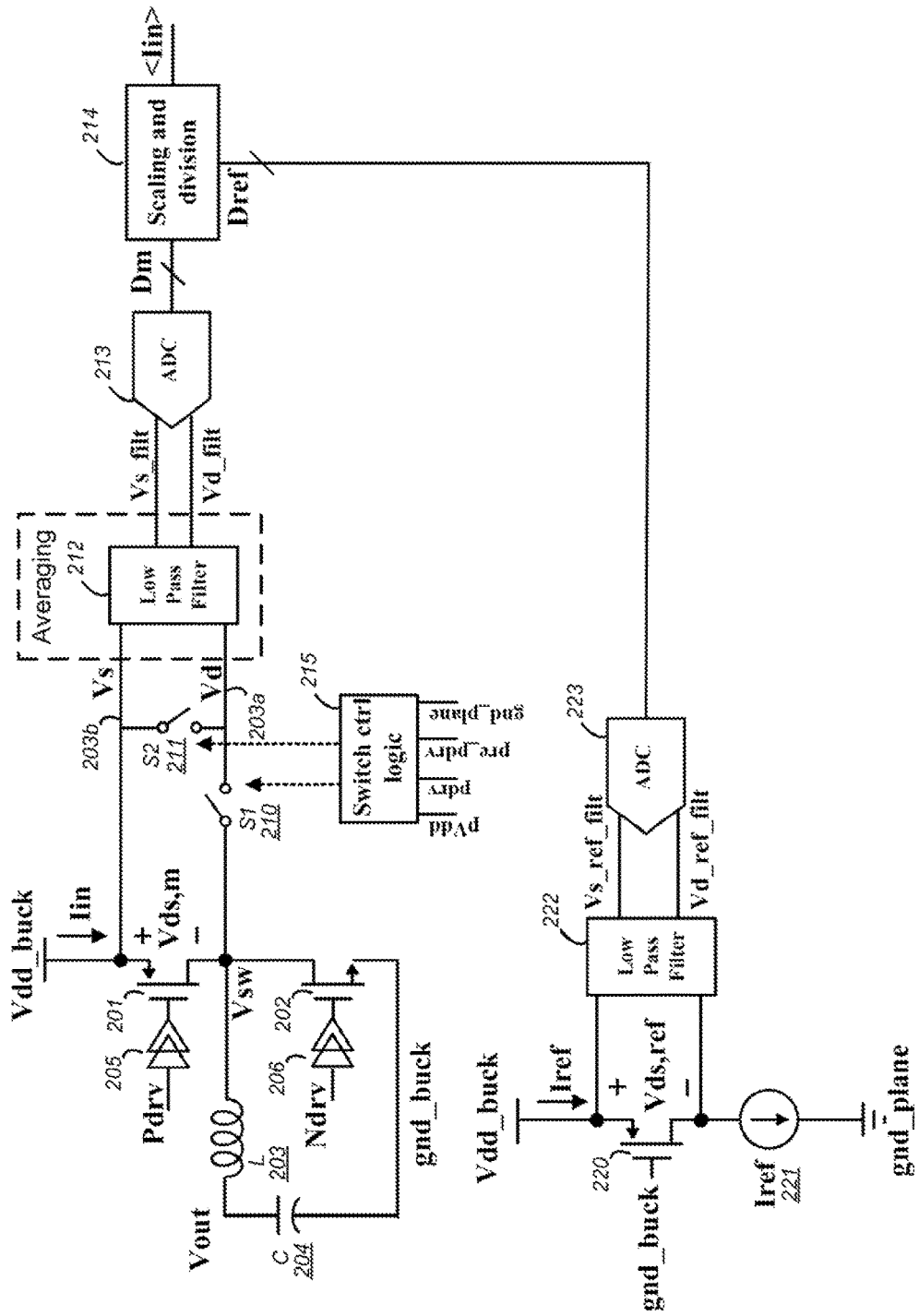
FIG. 2A illustrates a switching regulator and current measurement circuit according to another embodiment.

FIG. 2A illustrates an example switching regulator and current measurement circuit according to another embodiment. In this example implementation, a switching regulator includes a high side PMOS switching transistor 201, low side NMOS switching transistor 202, inductor L 203, capacitor C 204, high side P drive circuit 205, and low side N drive circuit 206. In this example, the switching regulator configuration receives an input voltage Vdd_buck and produces an output voltage Vout that is less than Vdd_buck relative to a ground reference, here gnd_buck. Accordingly, this example is sometimes referred to as a Buck switching regulator, Buck DC-DC converter, or just a "Buck" (Vin>Vout).

In this example, a terminal (e.g., a drain) of switching transistor 201 is coupled to a terminal of switch S1 210. Another terminal (e.g., a source) of switching transistor 201 is coupled to a terminal of switch S2 211. Switches S1 and S2 also have additional terminals that are coupled together. In this example, a current measurement circuit comprises a differential inputs Vd and Vs, for example, where Vd is coupled to the drain of the switching transistor (through switch S1) and Vs is coupled to the source of the switching transistor. Additionally, current measurement circuitry includes a voltage averaging circuit having a first input coupled to the first terminal, Vd, of the current measurement circuit and a second input coupled to the second terminal, Vs, of the current measurement circuit. In this example, the voltage averaging circuit is configured to produce a differential voltage, Vs_filt and Vd_filt, on differential outputs coupled to the differential inputs of an analog to digital converter (ADC) 213. The differential voltage from the voltage averaging circuit may correspond to an average of a current Iin through switching transistor 201, for example. In this example, the voltage averaging circuit is implemented using a low pass filter (LPF) 212.

In this example, current measurement circuit includes an ADC 213 having differential inputs coupled to receive a differential voltage across terminals 212a and 212b of the current measurement circuit. Accordingly, when switching transistor 201 is on, switch S1 is closed, switch S2 is open, and a drain to source voltage, Vds,m, across switching transistor 201 generated in response to switching transistor current Iin is received, averaged by LPF 212, and sampled by ADC 213, for example. In other embodiments describe below, an ADC may sample the voltage across the inputs of the current measurement circuit without averaging.

FIG. 2A also illustrates an example circuit that generates a reference voltage. In this example, a reference transistor 220 has a source coupled to Vdd_buck, a gate coupled to ground buck (e.g., the voltage at the gate of switching transistor 201 when turned on), and a drain coupled to a reference current source 221 that generates a current Iref in reference transistor 220, for example. Current Iref through reference transistor 220 produces a drain to source voltage Vds,ref. Vds,ref may be used as a reference voltage as described further below because reference transistor 220 may be matched to switching transistor 201 and because the source and gate of transistor 220 are set at equivalent control voltages as the control terminal (e.g., the gate) and source of switching transistor 201 when switching transistor 201 is turned on. For example, when switching transistor 201 is turned on, the gate of switching transistor 201 and the gate of reference transistor 220 may have approximately the same voltage, and the source of switching transistor 201 and the source of reference transistor 220 may have approximately the same voltage. Accordingly, if the switching transistor 201 and reference transistor 220 are matched, then the source-to-drain voltage across the reference transistor and the reference current Iref (which is set by design) may be used to determine the input current, Iin. Two transistors may be matched, for example, when the two transistors differ in size (e.g., width to length ratio, W/L) by some known amount (e.g., 1000:1). In this example, Vds,ref is received on differential inputs of another voltage averaging circuit implemented using a LPF 222. In this example, a second ADC 223 samples a differential voltage, Vd_ref_filt and Vs_ref_filt, at an output of LPC 222.

In this example, the outputs of ADC 213 and ADC 223 are coupled to a digital processor 214. Digital processor 214 may perform scaling and division, for example, and may calculate an average current from Vds,ref and Vds,m. Digital processor 214 may include logic circuits (e.g., an arithmetic logic unit (ALU) or application specific logic circuits), or custom or general purpose programmable processors (e.g., microcontrollers or microprocessors), for example. In other embodiments, the parameters described herein may be combined in the analog domain to produce a measure of Iin, for example. Accordingly, determining the current through the switching transistor as described herein may be performed in hardware, software, firmware, or combinations thereof, for example.

In this example, given measured values for Vds,m and Vds,ref, an average current through the switching transistor 201 may be determined according to the following relations:

$$\langle Iin \rangle = \mu Cox \frac{Wm}{l} * (Vgs - vto) * \langle Vds, m \rangle$$

$$Iref = \mu Cox \frac{Wref}{l} * (Vgs - vto) * Vds, ref$$

$$\langle Iin \rangle = k * Iref * \frac{w_m}{w_{ref}} * \frac{\langle Vds, m \rangle}{Vds, ref}$$

At high currents, Vds may result in errors in the above equation for Iin. Accordingly, an additional factor (e.g., a calibration factor) may be included in the equation for Iin to reduce error as follows:

$$\langle Iin \rangle = k * Iref * \frac{w_m}{w_{ref}} * \frac{\langle Vds, m \rangle}{Vds, ref} * (1 - 0.5 * \langle vds, m \rangle / D(Vdd - vthp)),$$

Where D is the duty cycle, Vdd is the input voltage (e.g., Vdd_buck), and vthp is the threshold voltage of the PMOS switching transistor. Other implementations may use analogous equations when using NMOS or other transistors as is known to those skilled in the art. It is to be understood that the above device equations are models of device behavior and are approximate. Other device equations and models may also be used for the current measurement in the embodiments herein.

Figure 2B:
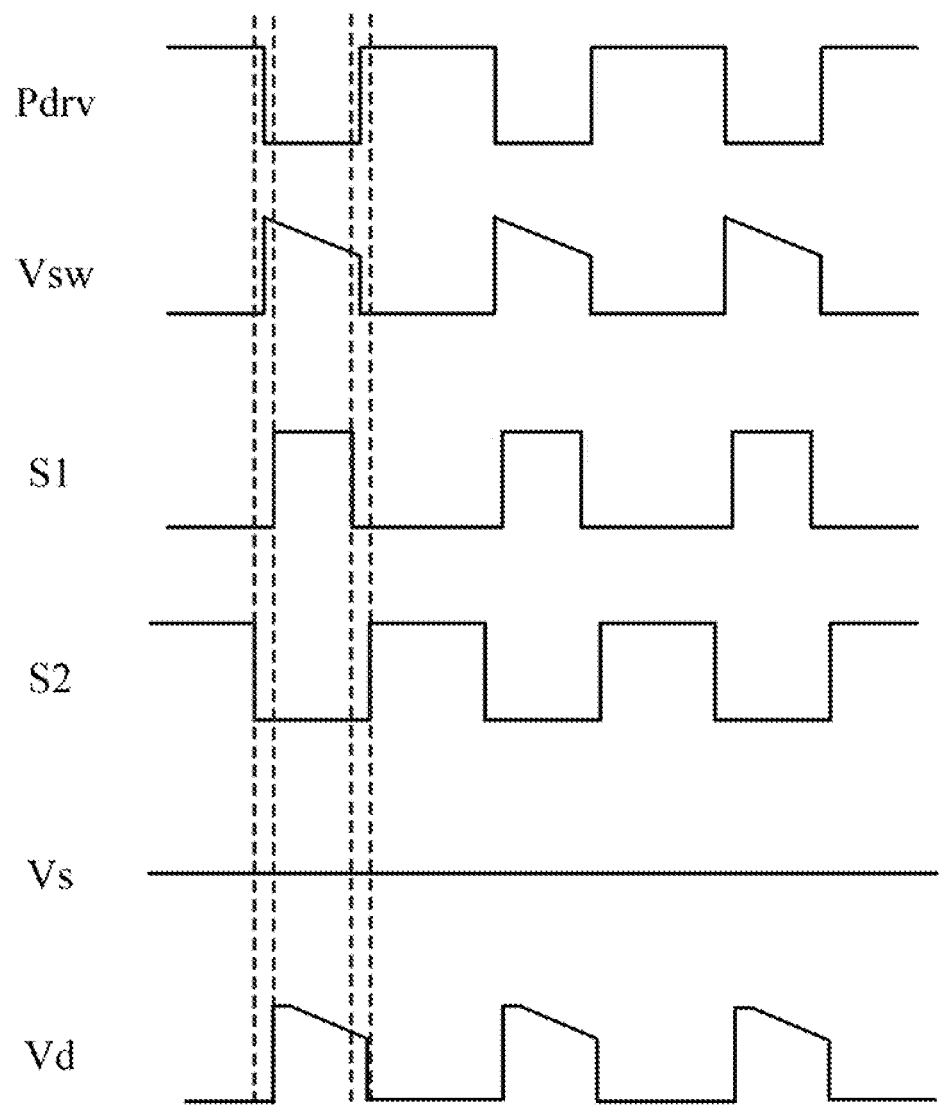
FIG. 2B illustrates a timing diagram for the example circuit in FIG. 2A.

FIG. 2B illustrates a timing diagram for the example circuit in FIG. 2A. Switching transistor 201 is turned on and off by the Pdry signal. When Pdry is high, switching transistor 201 is off, low side switching transistor 202 is on, Vsw is near ground, S1 is open, and S2 is closed. When Pdry goes low, switching transistor 201 turns on, low side switching transistor 202 turns off, and current begins to flow between the terminals of the switching transistor 201. With switching transistor 201 on, a voltage is applied across inductor 203 and the current increases. However, resistance between the terminals of transistor 201 (e.g., "ON" resistance, Rdson) causes a voltage drop, Vds, across the terminals to increase approximately linearly as the current increases and increases the difference between Vsw and Vdd_buck. Accordingly, Vsw starts out high and decreases as the switching transistor current increases. Switch control logic 215 in FIG. 2A controls switches S1 and S2 so that the switches turn on in a non-overlapping manner as illustrated in FIG. 2B. When switching transistor 201 is on, S1 is on and S2 is off. Accordingly, one input to the current measurement circuit receives Vd, the voltage on the drain (here, equal to Vsw), and the other input receives Vs, the voltage on the source. The difference between these voltages may be used to determine either the instantaneous current or average current in the switching transistor 201, for example. In this example, LPF 212 is used to determine an average current as described above.

When Pdry goes high again, switching transistor 201 is turned off, S1 is turned off (opened), S2 is turned on (closed), and the inputs to the current measurement circuit are short circuited to produce zero differential voltage input, thereby emulating the zero current in the switching transistor 201.

Figure 3:
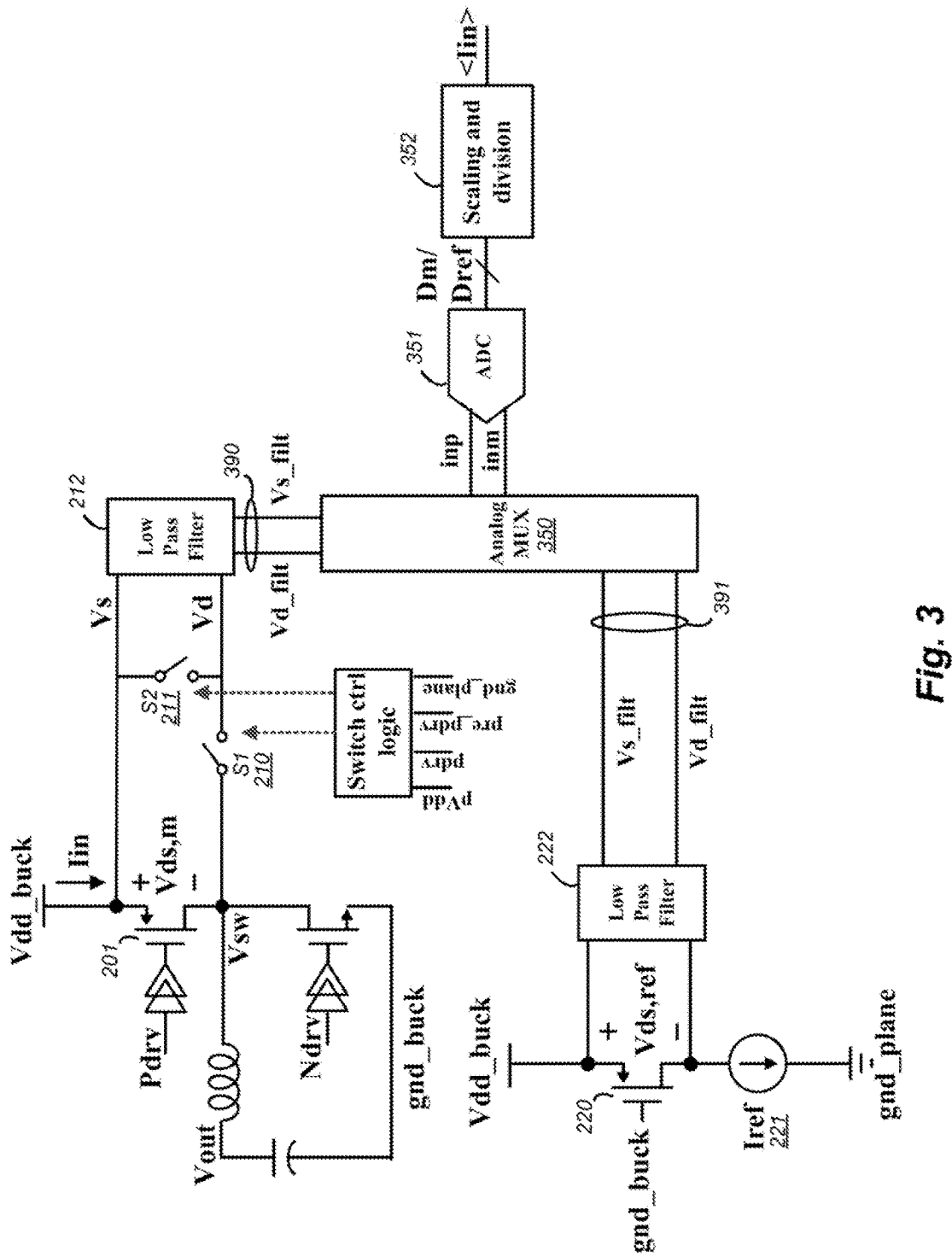
FIG. 3 illustrates an example switching regulator and current measurement circuit according to another embodiment.

FIG. 3 illustrates an example switching regulator and current measurement circuit according to another embodiment. In this example, a single ADC 351 is coupled to input terminals of the current measurement circuit (e.g., Vd and Vs to receive Vds,m) and across a reference transistor through a multiplexer 350. For instance, multiplexer 350 has first differential inputs 390 coupled to terminal Vd of the current measurement circuit and terminal Vs of the current measurement circuit (e.g., through LPF 212) and second differential inputs 391 coupled to the first terminal (e.g., a drain) of the reference transistor and the second terminal (e.g., a source) of the reference transistor (e.g., through LPF 222). Analog to digital converter 351 has differential inputs, inp/inm, coupled to differential outputs of the multiplexer. In one embodiment, MUX 350 is set to couple inputs 390 to ADC 351 during for a majority of the time, for example, and set to couple inputs 391 to ADC 351 on a periodic basis to update the reference measurements, for example. In some embodiments, the time period may be programmable (e.g., every 16 ms to every 100 ms).

Figure 4:
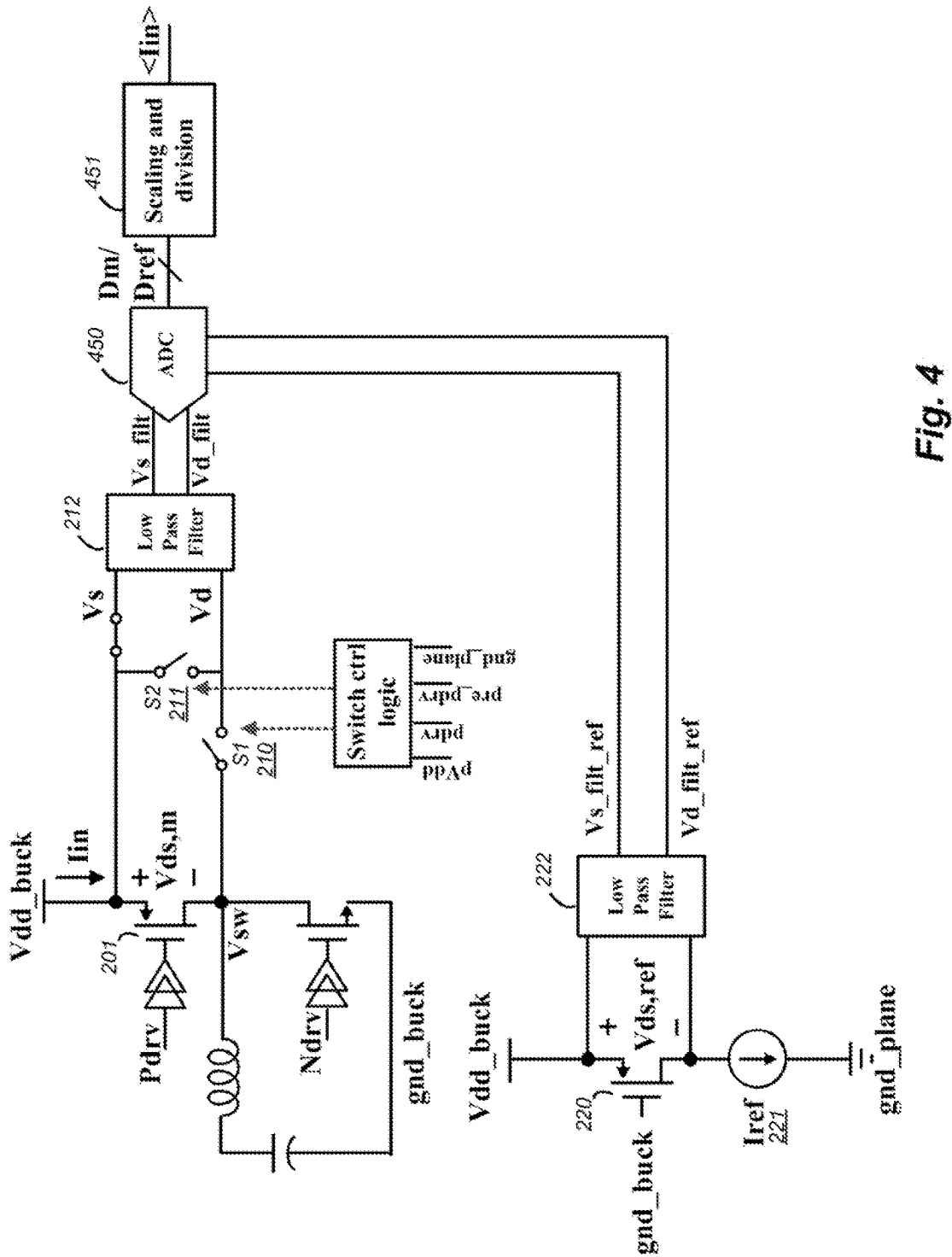
FIG. 4 illustrates an example switching regulator and current measurement circuit according to yet another embodiment.

FIG. 4 illustrates an example switching regulator and current measurement circuit according to yet another embodiment. In this example, inputs of an ADC 450 are coupled to inputs Vs and Vd of the current measurement circuit and differential outputs of a reference circuit are used as reference inputs for the ADC 450. More specifically, a current measurement circuit may further comprise ADC 450 having differential inputs coupled to terminal Vd of the current measurement circuit and terminal Vs of the current measurement circuit, and differential reference inputs coupled to a first terminal (e.g., the source) of the reference transistor 220 and the second terminal (e.g., the drain) of the reference transistor. In this example, the reference inputs of the ADC are coupled to the source and drain of transistor 220 through LPF 222 to receive averaged differential inputs Vs_filt_ref and Vd_filt_ref.

Figure 5:
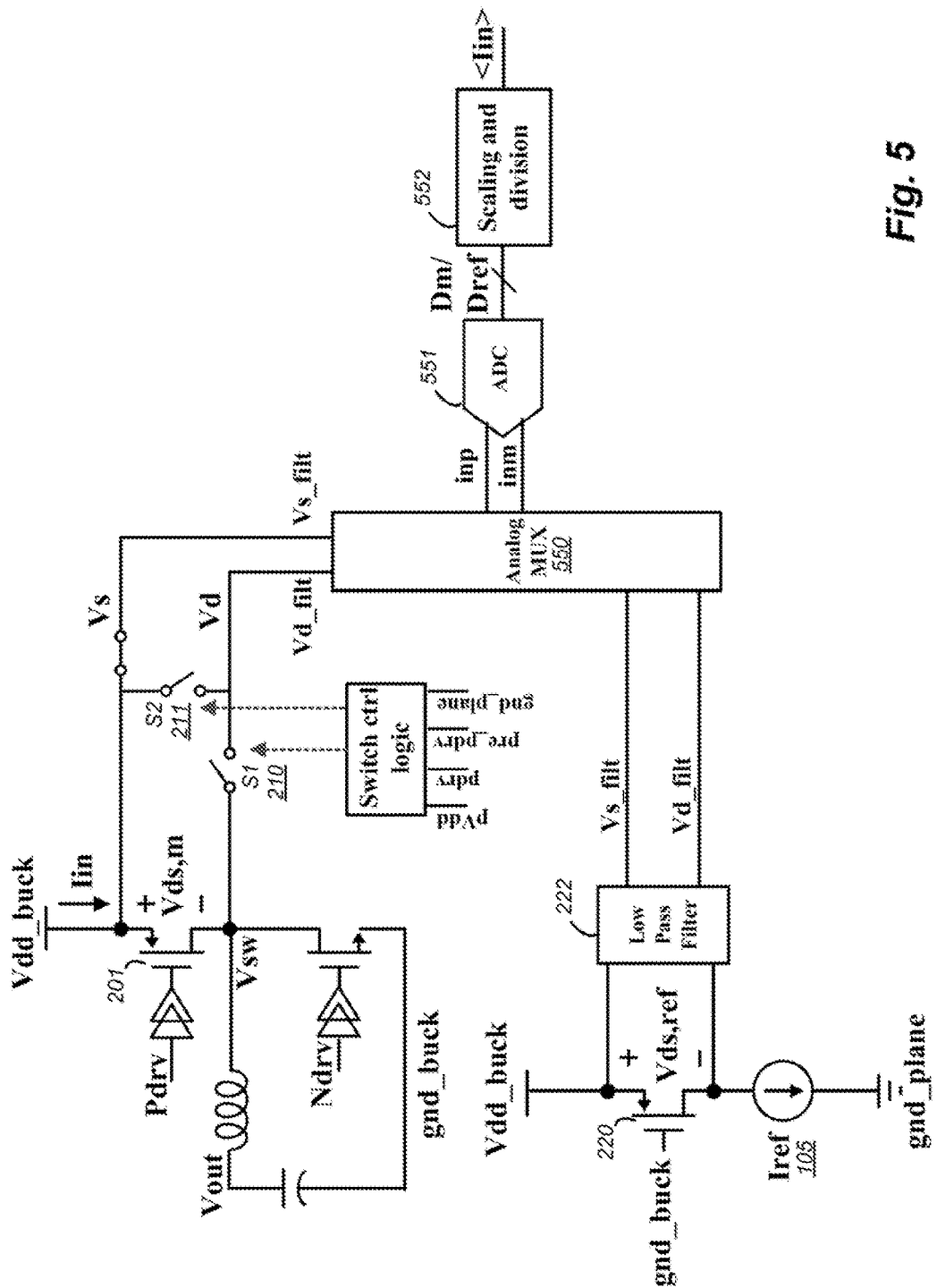
FIG. 5 illustrates an example switching regulator and current measurement circuit according to yet another embodiment.

FIG. 5 illustrates an example switching regulator and current measurement circuit according to yet another embodiment. As mentioned above, some embodiments may not include an averaging circuit to average the voltage across the switching transistor 201 when it is on. In this example, differential inputs, inp/inm, of ADC 551 are coupled to terminals Vs and Vd of the current measurement circuit (e.g., through MUX 550) to receive Vds,m without an averaging circuit. ADC 551 may sample Vds,m through the MUX or directly. Averaging may be done digitally or not at all, for example.

Figure 6:
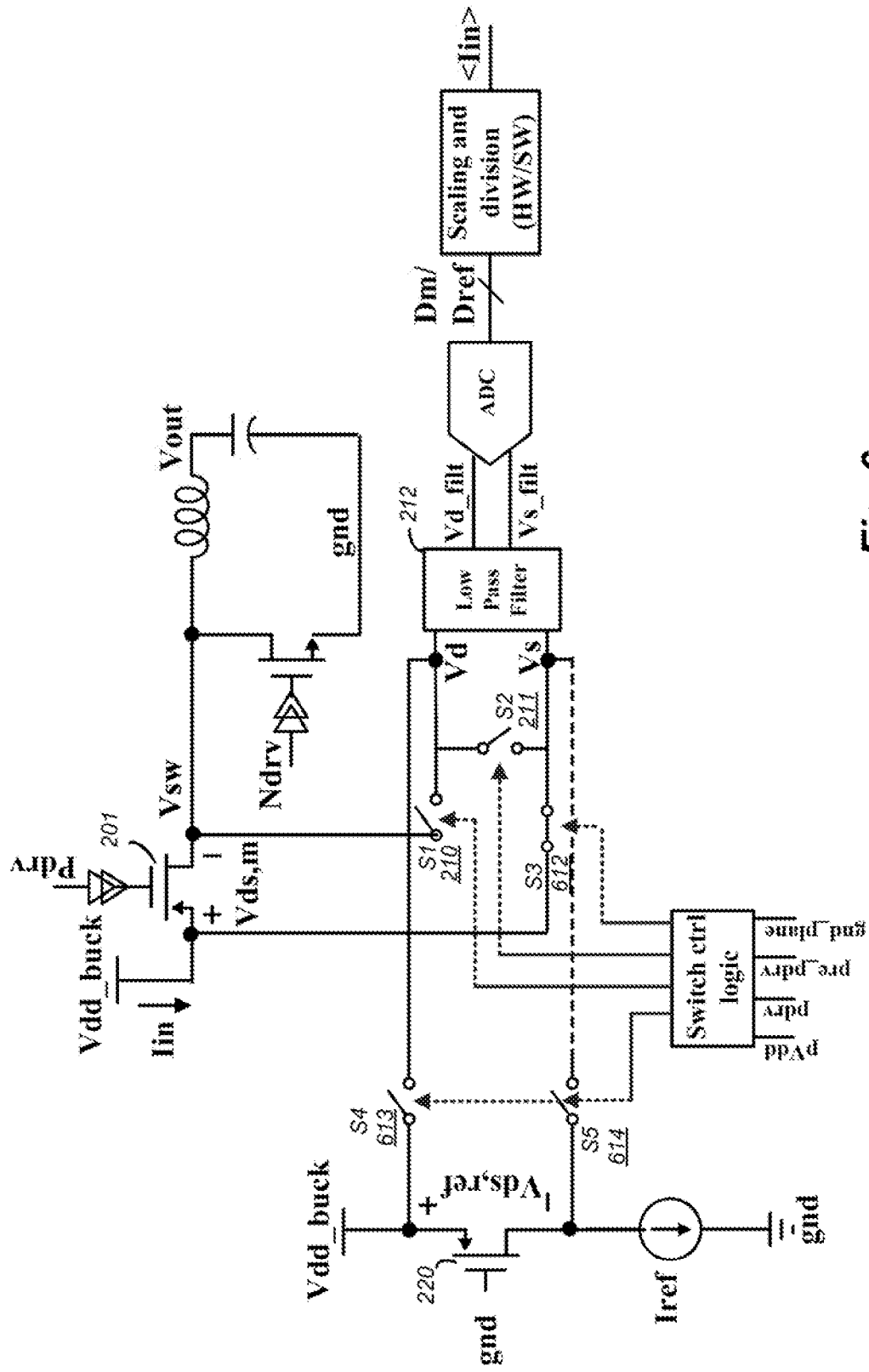
FIG. 6 illustrates an example switching regulator and current measurement circuit according to yet another embodiment.

FIG. 6 illustrates an example switching regulator and current measurement circuit according to yet another embodiment. In this example, switch S1 210 is further used with switch S3 610 to completely decouple the input of LPF 212 from the terminals (e.g., drain and source) of switching transistor 201 periodically. For instance, the circuit in FIG. 6 includes switches S3, S4, and S5. An additional switch S3 612 is configured between an input terminal (e.g., the source) of the switching transistor 201 and a terminal (Vs) of the current measurement circuit. Switch S4 613 is configured between a terminal (e.g., the source) of reference transistor 220 and a terminal (Vd) of the current measurement circuit. Switch S5 614 is configured between a terminal (e.g., the drain) of reference transistor 220 and a terminal (Vs) of the current measurement circuit. Both S1 and S3 may be opened periodically to obtain a reference measurement for determining the current through switching transistor 201. Accordingly, when S1 and S3 are open, switch S4 613 and switch S5 614 may be closed to couple terminals of reference transistor 220 to inputs of the LPF 212 to average and sample Vds,ref, for example.

Figure 7:
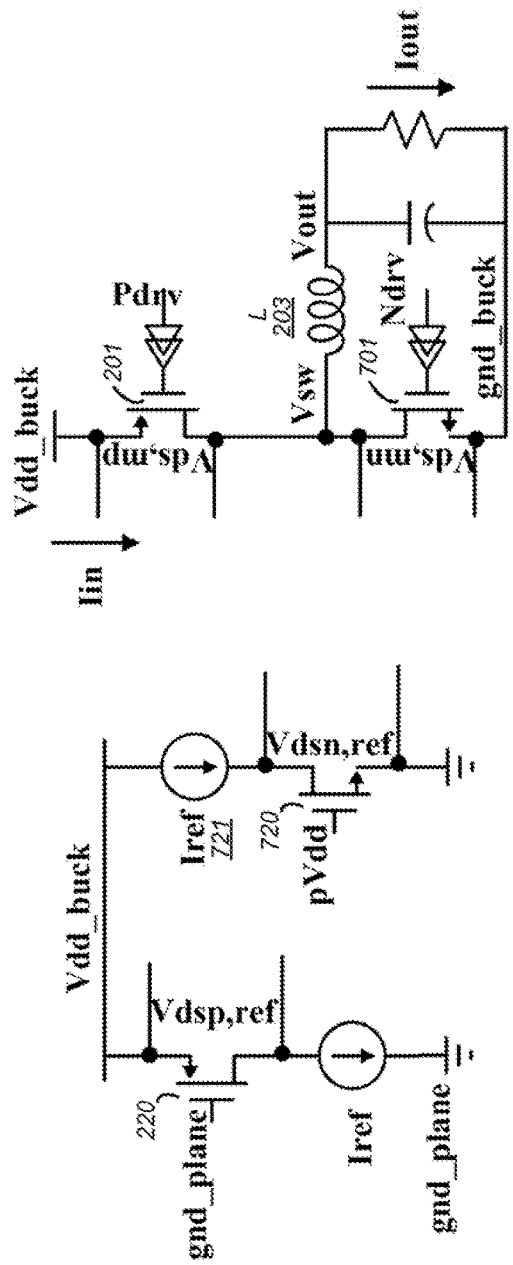
FIG. 7 illustrates an example switching regulator and current measurement circuit according to yet another embodiment.
Figure 7:
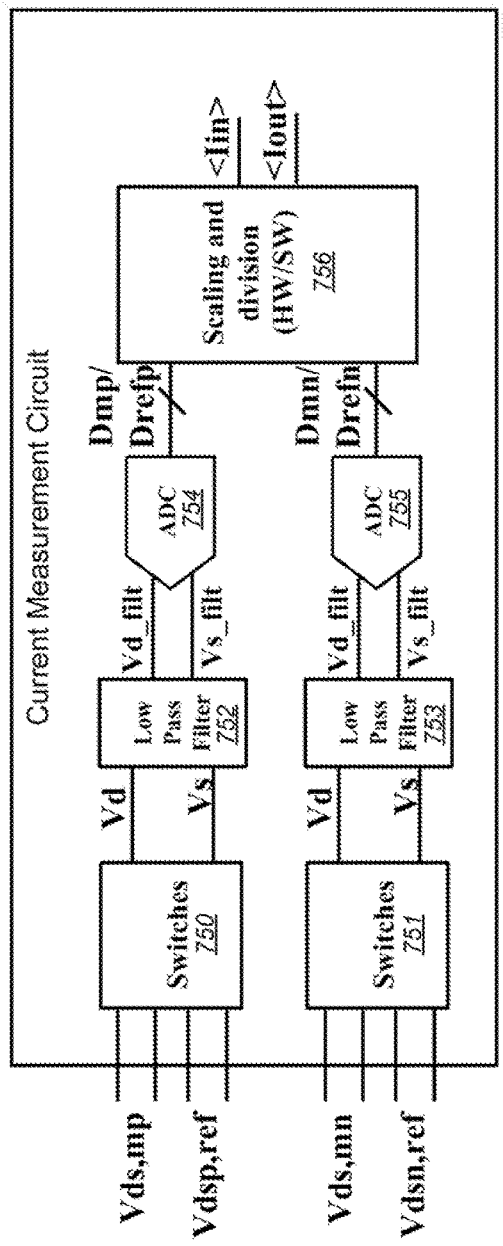

FIG. 7 illustrates an example switching regulator and current measurement circuit according to yet another embodiment. In some embodiments, current through another switching transistor, such as low side NMOS switching transistor 701, may be measured instead of, or in addition to, measuring current through switching transistor 201. For example, low side NMOS 701 may have a reference terminal (e.g., a source coupled to ground) coupled to one input terminal of a current measurement circuit (similar to the Vdd input of PMOS switching transistor 201) and a switching terminal (e.g., a drain coupled to Vsw) coupled to another input terminal of the current measurement circuit through a switch (similar to switch S1 in the PMOS case). When NMOS 701 is on, the terminals of switching transistor 701 may be coupled to a current measurement circuit (e.g., via a switch between Vsw and an input of the measurement circuits), and when NMOS 701 is off, Vsw is decoupled from the current measurement circuit by a switch and the input terminals of the current measurement circuit are coupled together. Also, in some embodiments, NMOS 701 terminal voltages Vds,mn may be combined with a reference voltage, Vdsn,ref, from a NMOS reference transistor 720 driven by a current source 721, for example, and used to determine the current in the NMOS using NMOS transistor equations. Switches 751 may couple Vds,mn and Vdsn,ref to a current measurement circuit. In this example, a current measurement circuit includes LPF 753, ADC 755, and digital processor 756, which perform functions as described above.

In another embodiment, multiple switching transistors in a switching regulator may be used to determine current in a switching regulator. In this example, both PMOS 201 and NMOS 701 may be used to determine output current, Iout, of the switching regulator. For instance, when PMOS 201 is on, NMOS 701 is off, and current flows from Vdd_buck, through PMOS 201, through inductor 203, and into a load modeled here as a resistor. In this state, current through the inductor typically ramps up (increases). When NMOS 701 is on, PMOS 201 is off, and current flows from ground, through NMOS 701 (because current does not change instantaneously through an inductor), through inductor 203, and into the load. In this state, current through the inductor typically ramps down (decreases). Current through both devices may be measured as described herein.

Figure 8:
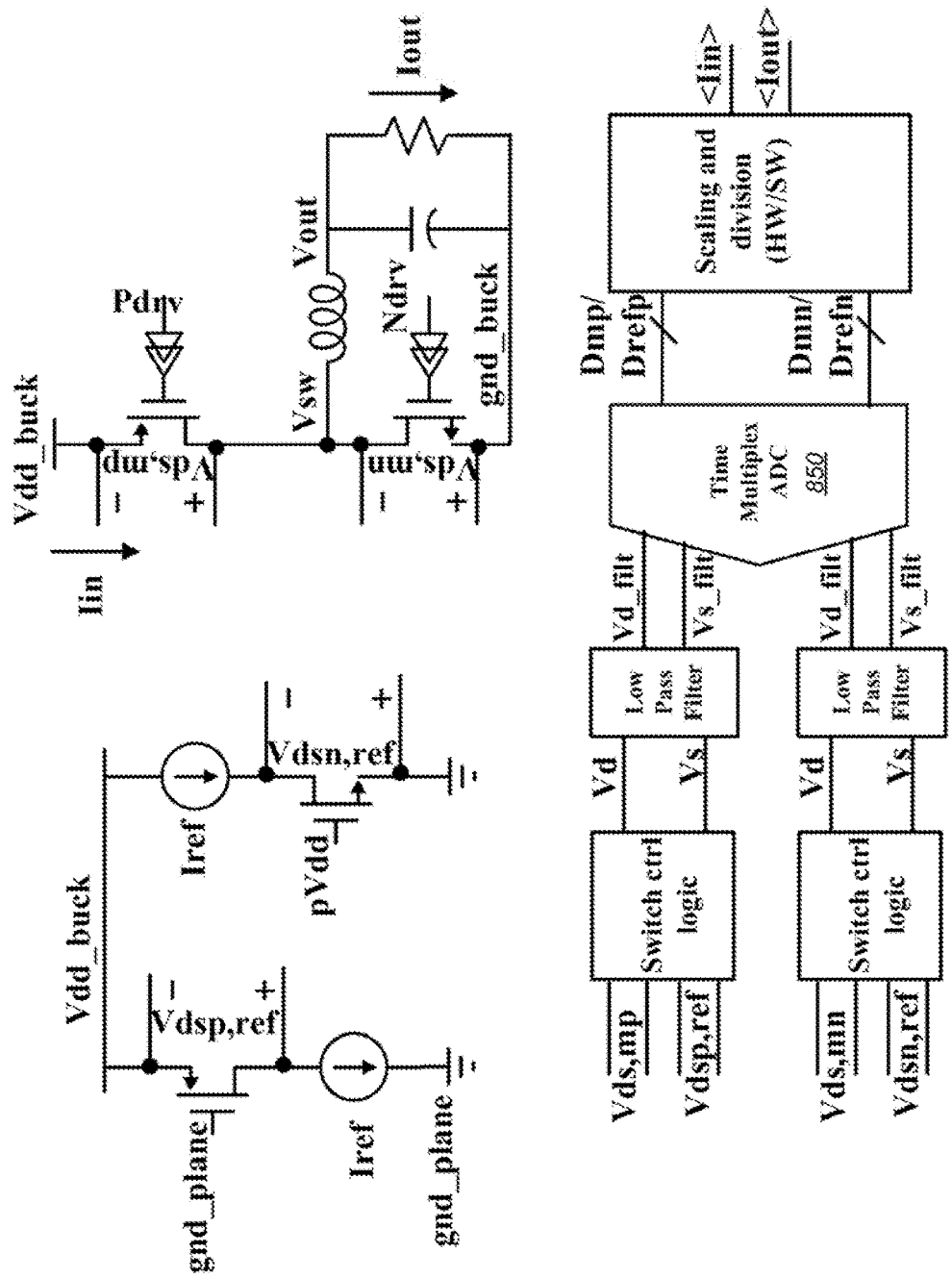
FIG. 8 illustrates an example switching regulator and current measurement circuit according to yet another embodiment.

In this example, voltage across the PMOS 201 when the PMOS is on, Vds,mp, is coupled with a PMOS reference transistor voltage, Vdsp,ref, through switches 750 to LPF 752, averaged, and sampled in ADC 754. Similarly, voltage across the NMOS 701 when the NMOS is on, Vds,mn, is coupled with a NMOS reference transistor voltage, Vdsn,ref, through switches 751 to LPF 753, averaged, and sampled in ADC 755. Sampled PMOS switching transistor and PMOS reference transistor voltages, Dmp/Drefp, and sampled NMOS switching transistor and NMOS reference transistor voltages, Dmn/Drefn, are processed digitally, for example, using hardware (HW) or software (SW), or both, to produce either the output current, Tout, or input current, Iin, wherein Iin is the current through PMOS 201 and Tout is the total current through PMOS 201 and NMOS 701, for example. FIG. 8 illustrates another example embodiment similar to the embodiment in FIG. 7 but using a signal time multiplexed ADC.

Figure 9:
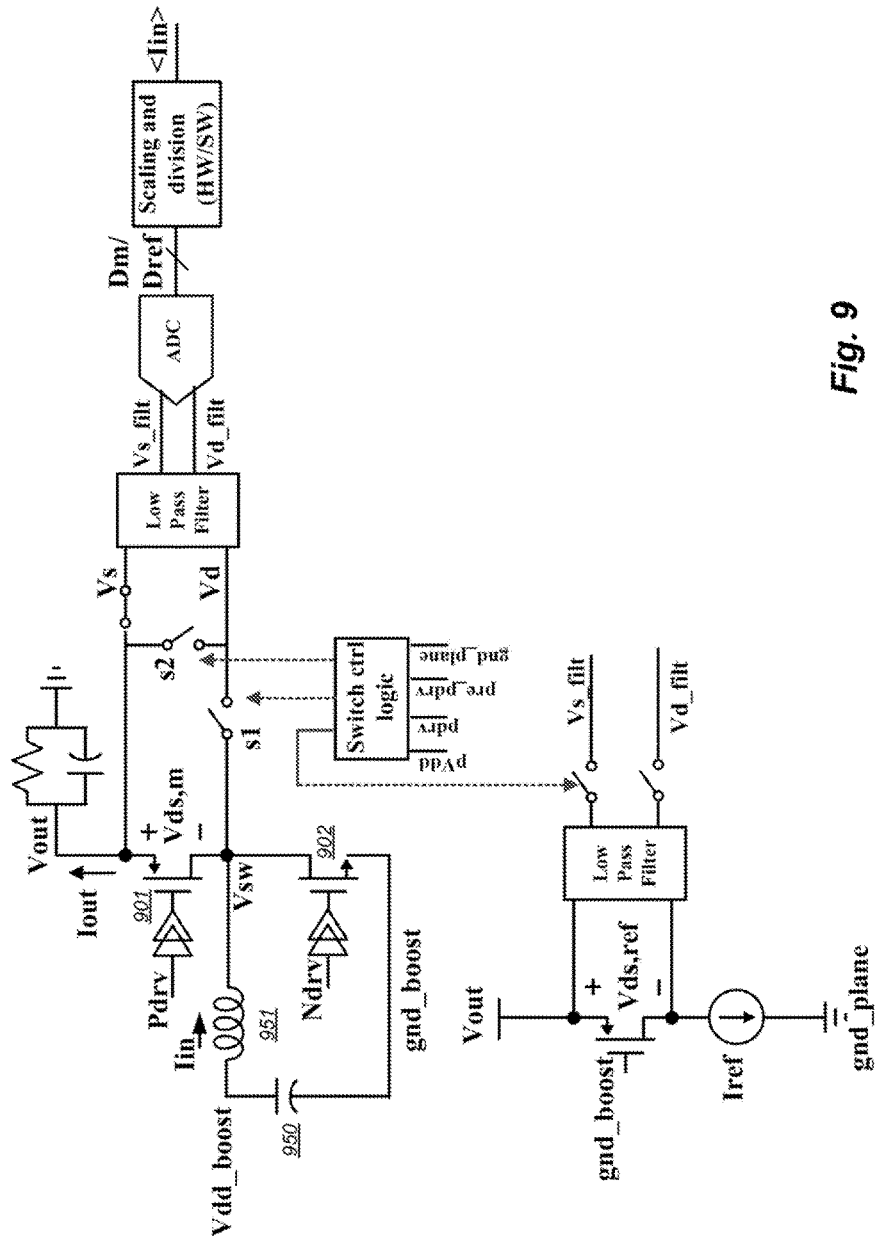
FIG. 9 illustrates an example boost switching regulator and current measurement circuit according to yet another embodiment.

FIG. 9 illustrates an example boost switching regulator and current measurement circuit according to yet another embodiment. This example illustrates application of the above techniques to a boost switching regulator, wherein Vin is less than Vout. In this example, a boost switching regulator receives an input voltage, Vdd_boost on an input terminal coupled to a capacitor 950 to ground. Vdd_boost is coupled through inductor 951 to a switching node having a switching voltage Vsw. In this example, Vsw is coupled to ground through NMOS switching transistor 902. NMOS 902 could be replaced with a diode in other embodiments. PMOS switching transistor 901 is coupled between Vsw and an output node having a voltage Vout (Vout>Vin). Output current, Iout, through switching transistor 901 may be measured using the techniques described herein using switch S1 and switch S2, the operation of which are describe above. In this example, Iin may be measured by measuring the current through NMOS 902 and PMOS 901 as described above, for example.

Figure 10:
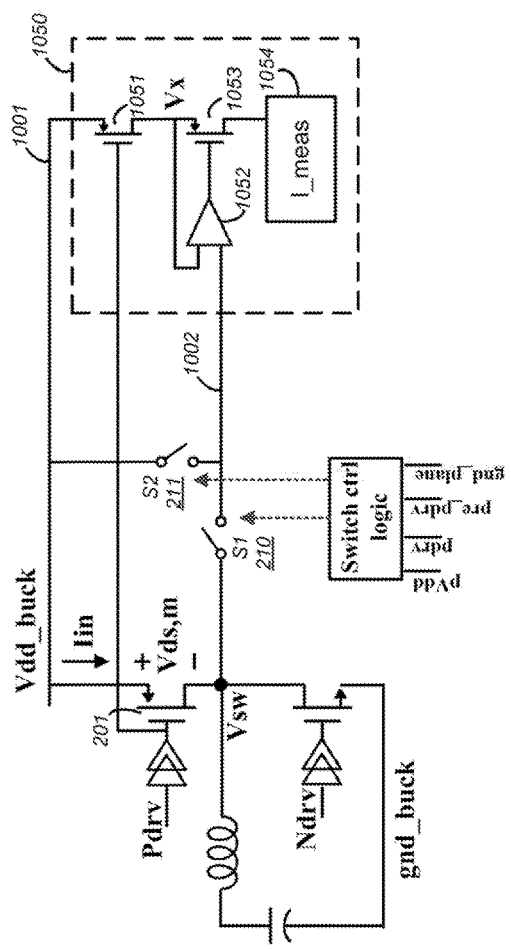
FIG. 10 illustrates an example switching regulator and current measurement circuit with a sense transistor according to another embodiment.

FIG. 10 illustrates an example switching regulator and current measurement circuit with a sense transistor according to another embodiment. In this example, a switching transistor in a Buck switching regulator has a terminal (e.g., a source) coupled to Vdd_buck and a terminal (e.g., a drain) coupled to a switching node having a voltage Vsw. As described above, a current measurement circuit has a first terminal 1001 coupled to one terminal of switching transistor 201 (e.g., at the source) and a second terminal 1002 coupled to another terminal of switching transistor 201 (e.g., at the drain) through switch S1 210. Switch S2 selectively couples the terminals of the current measurement circuit together when switching transistor is off.

In this example, current measurement circuit 1050 comprises a sense transistor 1051 having a first terminal configured to receive voltage Vdd_buck, a second terminal coupled to the switching node, and a control terminal configured to receive a control voltage equal to the control voltage on the control terminal of the switching transistor 201 when the switching transistor is turned on. In this example, sense transistor 1051 is a PMOS transistor having a gate coupled to the gate of PMOS switching transistor 201 so that when PMOS 201 turns on, sense PMOS 1051 also turns on. When PMOS 201 is on, S1 is closed, and Vsw is coupled to the input of amplifier 1052. The output of amplifier 1052 is coupled to the gate of PMOS transistor 1053. The source of PMOS 1053 is coupled to the other input of amplifier 1052 in a unity gain configuration, for example. In this configuration, a voltage Vx at the input of the amplifier is approximately equal to Vsw. Thus, Vx on the drain of transistor 1051 is coupled to Vsw and the drain of PMOS 1051 is at the same voltage as the drain of PMOS 201. Given that the gate, drain, and source of PMOS 201 is the same as PMOS 1051, the currents will be the same if the transistor sizes are the same, or advantageously the currents will differ by a difference in the transistor sizes (e.g., W/L), where the sense device may be much smaller than the switching transistor, for example. The current through the sense transistor may be measured using a current sense circuit I_meas 1054. As above, when PMOS 201 is off, S1 is opened and S2 is advantageously closed so the current in PMOS sense transistor 1051 goes to zero to emulate the zero current in PMOS 201 when it is off. A similar topology could be used for an NMOS switching transistor and an NMOS sense transistor, for example.

Figure 11:
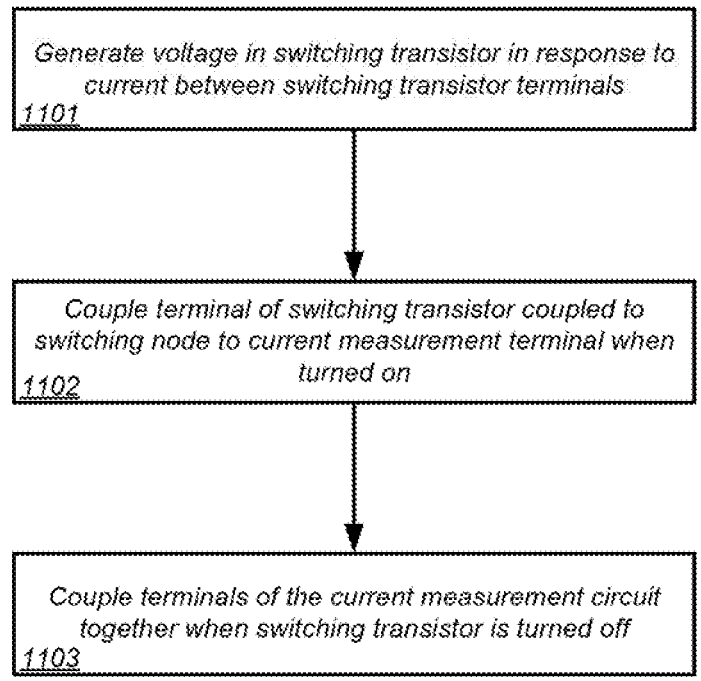
FIG. 11 illustrates a method of measuring current in a switching regulator according to an embodiment.

FIG. 11 illustrates a method of measuring current in a switching regulator according to an embodiment. At 1101, a voltage between a first terminal and a second terminal of a switching transistor is generated in response to a current between the first terminal and second terminal. For example, the first terminal may receive a first voltage, the second terminal is coupled to a switching node, and a control terminal receives a control voltage to turn the switching transistor on and off. At 1102, a terminal of the switching transistor coupled to the switching node is coupled to a current measurement circuit terminal when the switching transistor is turned on. For example, a first switch configured between the second terminal of the switching transistor and a first terminal of a current measurement circuit may be closed when the switching transistor is turned on. A second terminal of the current measurement circuit may be coupled to the first terminal of the switching transistor, for example. At 1103, terminals of the current measurement circuit are coupled together when the switching transistor is turned off. This may be advantageous to emulate zero current in in the switching transistor when it is off. For example, a second switch configured between the first terminal of the current measurement circuit and the second terminal of the current measurement circuit may be close when the switching transistor is turned off. Accordingly, when the switching transistor is on the first switch is closed and the second switch is open, and when the switching transistor is off the first switch is open and the second switch is closed.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A circuit comprising:
    a switching regulator comprising a switching transistor, the switching transistor having a first terminal configured to receive a first voltage, a second terminal coupled to a switching node, and a control terminal configured to receive a control voltage to turn the switching transistor on and off;
    a current measurement circuit having a first terminal and a second terminal;
    a first switch configured between the switching node and the first terminal of the current measurement circuit; and
    a second switch configured between the second terminal of the current measurement circuit and the first terminal of the current measurement circuit, wherein the second terminal of the current measurement circuit is coupled to the first terminal of the switching transistor,
    wherein when the switching transistor is on the first switch is closed and the second switch is open, and when the switching transistor is off the first switch is open and the second switch is closed.

2. The circuit of claim 1 wherein an average current through the switching transistor is measured by the current measurement circuit when the switching transistor is turned on and off.

3. The circuit of claim 1 wherein the current measurement circuit comprises a differential input.

4. The circuit of claim 3, the current measurement circuit comprising an analog to digital converter having differential inputs coupled to receive a differential voltage across the first terminal of the current measurement circuit and the second terminal of the current measurement circuit.

5. The circuit of claim 1, the current measurement circuit further comprising a voltage averaging circuit having a first input coupled to the first terminal of the current measurement circuit and a second input coupled to the second terminal of the current measurement circuit, the voltage averaging circuit configured to produce the differential voltage on differential outputs coupled to the differential inputs of the analog to digital converter, wherein the differential voltage from the voltage averaging circuit corresponds to an average current through the switching transistor.

6. The circuit of claim 5 wherein the voltage averaging circuit is a low pass filter.

7. The circuit of claim 1, the current measuring circuit further comprising a reference transistor having a first terminal coupled to the first voltage, a second terminal coupled to a reference current source, and a control terminal coupled to a second control voltage equivalent to the control voltage on the control terminal of the switching transistor when the switching transistor is turned on.

8. The circuit of claim 7 wherein a first differential voltage across the first and second terminals of the switching transistor is combined with a second differential voltage across the first and second terminals of the reference transistor to determine a current through the switching transistor.

9. The circuit of claim 7, the current measuring circuit further comprising a voltage averaging circuit having a first input coupled to the first terminal of the reference transistor and a second input coupled to the second terminal of the reference transistor, the voltage averaging circuit configured to produce the second differential voltage on differential outputs, wherein the second differential voltage is an average differential voltage.

10. The circuit of claim 9 further comprising:
a third switch configured between the first terminal of the switching transistor and the second terminal of the current measurement circuit;
a fourth switch configured between the first terminal of the reference transistor and the first terminal of the current measurement circuit; and
a fifth transistor configured between the second terminal of the reference transistor and the second terminal of the current measurement circuit.

11. The circuit of claim 7, the current measurement circuit further comprising:
a first analog to digital converter having differential inputs coupled to the first terminal of the current measurement circuit and the second terminal of the current measurement circuit; and
a second analog to digital converter having differential inputs coupled to the first terminal of the reference transistor and the second terminal of the reference transistor.

12. The circuit of claim 7, the current measurement circuit further comprising:
a multiplexer having first differential inputs coupled to the first terminal of the current measurement circuit and the second terminal of the current measurement circuit and second differential inputs coupled to the first terminal of the reference transistor and the second terminal of the reference transistor; and
a first analog to digital converter having differential inputs coupled to differential outputs of the multiplexer.

13. The circuit of claim 7, the current measurement circuit further comprising an analog to digital converter having differential inputs coupled to the first terminal of the current measurement circuit and the second terminal of the current measurement circuit and differential reference inputs coupled to the first terminal of the reference transistor and the second terminal of the reference transistor.

14. The circuit of claim 1, the current measurement circuit comprising a sense transistor having a first terminal configured to receive the first voltage, a second terminal coupled to the switching node, and a control terminal configured to receive the control voltage on the control terminal of the switching transistor when the switching transistor is turned on.

15. The circuit of claim 1 wherein the switching transistor is a PMOS transistor.

16. The circuit of claim 15 wherein the current measurement circuit includes a third terminal and a fourth terminal, the circuit further comprising:
an NMOS switching transistor, the NMOS switching transistor having a first terminal configured to receive a reference voltage, a second terminal coupled to the switching node, and a control terminal configured to receive a second control voltage to turn the NMOS switching transistor on and off;
a third switch configured between the switching node and the third terminal of the current measurement circuit; and
a fourth switch configured between the fourth terminal of the current measurement circuit and the third terminal of the current measurement circuit, wherein a terminal of the fourth switch is coupled to the first terminal of the NMOS switching transistor,
wherein when the NMOS switching transistor is on the third switch is closed and the fourth switch is open, and when the NMOS switching transistor is off the third switch is open and the fourth switch is closed.

17. The circuit of claim 16 wherein the current measurement circuit determines an output current of the switching regulator.

18. The circuit of claim 1 wherein the switching transistor is a NMOS transistor.

19. The circuit of claim 1 wherein the switching transistor is a Buck switching regulator.

20. The circuit of claim 1 wherein the switching transistor is a Boost switching regulator.

21. A method of supplying power comprising:
generating a voltage between a first terminal and a second terminal of a switching transistor in response to a current between the first terminal and second terminal, wherein the first terminal receives a first voltage, the second terminal is coupled to a switching node, and a control terminal receives a control voltage to turn the switching transistor on and off;
closing a first switch coupled between the second terminal of the switching transistor and a first terminal of a current measurement circuit when the switching transistor is turned on, wherein a second terminal of the current measurement circuit is coupled to the first terminal of the switching transistor; and
closing a second switch coupled between the first terminal of the current measurement circuit and the second terminal of the current measurement circuit when the switching transistor is turned off;
wherein when the switching transistor is on the first switch is closed and the second switch is open, and when the switching transistor is off the first switch is open and the second switch is closed.

22. A circuit comprising:
a switching regulator comprising a switching means for selectively coupling a first voltage to a switching node, the switching means having a first terminal configured to receive the first voltage and a second terminal coupled to the switching node;
means for measuring current in the switching means comprising a first terminal and a second terminal;

first means for selectively coupling a switching voltage on the switching node to the first terminal of the means for measuring current; and second means for selectively coupling the first terminal and the second terminal of the means for measuring current together, wherein when the switching means couples the first voltage to the switching node the first means couples the switching voltage to the first terminal of the means for measuring current and the second means does not couple the first terminal and the second terminal of the means for measuring current together, and wherein when the switching means does not couple the first voltage to the switching node the first means does not couple the switching voltage to the first terminal of the means for measuring current and the second means couples the first terminal and the second terminal of the means for measuring current together.

\* \* \* \* \*